United States Patent
Dannenberg

[19]

[11] Patent Number: 5,822,335
[45] Date of Patent: Oct. 13, 1998

[54] DISPLAY OF ELECTRONIC SELF-TEST RESULTS USING GAUGE DIAL POINTERS

[75] Inventor: Robert D. Dannenberg, Garrett, Ind.

[73] Assignee: Navistar International Transportation Corp., Chicago, Ill.

[21] Appl. No.: 935,762

[22] Filed: Aug. 26, 1992

[51] Int. Cl.$^6$ .................................................. G01R 31/28
[52] U.S. Cl. .................... 371/22.5; 377/24.1; 371/25.1
[58] Field of Search .................. 371/16.4, 25.1, 371/22.5, 22.6, 24, 67.1, 22.1; 377/24.1; 364/424.03, 550, 551.01

[56] References Cited

U.S. PATENT DOCUMENTS

| | | | |
|---|---|---|---|
| 4,300,205 | 11/1981 | Tansuwan | 364/578 |
| 4,373,384 | 2/1983 | Olson et al. | 73/119 A |
| 4,467,323 | 8/1984 | Kling et al. | 345/24 |
| 4,517,839 | 5/1985 | Van Dyke | 324/772 |
| 4,701,867 | 10/1987 | Bruggemann | 371/25.1 |
| 4,710,888 | 12/1987 | Burke et al. | 364/561 |
| 4,803,646 | 2/1989 | Burke et al. | 377/24.1 |
| 5,046,007 | 9/1991 | McCrery et al. | 701/35 |
| 5,150,609 | 9/1992 | Ebner et al. | 73/117.3 |

*Primary Examiner*—Trinh L. Tu
*Attorney, Agent, or Firm*—Dennis K. Sullivan

[57] ABSTRACT

Results of self-testing of portions of an automotive vehicle's electronic instrument cluster are displayed on the cluster's speedometer and tachometer. A fault in a particular portion is indicated by operating the pointers of both meters in unison by repetitive sweeping from zero to a particular location corresponding to the particular portion containing the fault. Detection of no faults is indicated by sweeping both pointers in unison from zero to maximum and back. A person can judge the movements of the meters by observing whether the pointers sweep smoothly in unison or in an erratic manner.

22 Claims, 3 Drawing Sheets

DISPLAY OF ELECTRONIC SELF-TEST RESULTS USING GAUGE DIAL POINTERS

FIELD OF THE INVENTION

This invention relates to instrument clusters of automotive vehicles, and in particular to the self-testing of an electronic instrument cluster.

BACKGROUND AND SUMMARY OF THE INVENTION

The commercial availability of increasingly sophisticated electronics enables electronic instrument clusters in today's automotive vehicles to perform increasingly complex functions. For maintenance and service of such instrument clusters, it is desirable that fault detection, isolation, and reporting capabilities be designed into the electronic circuitry. Otherwise, the servicing mechanic may have a tedious investigative task to determine if a problem is caused by sensors that serve the instrument cluster, wiring associated with the cluster, the cluster electronics, the cluster display, or other auxiliary devices, such as odometers and data interfaces.

While it would be possible to incorporate diagnostic displays into a vehicle instrument cluster, the inclusion would add to the base vehicle cost, and this may impose too strict a penalty on a base vehicle where the reliability of an instrument cluster may be high even though it is not 100% for the useful life of the vehicle.

The present invention relates to a novel means for displaying self-test results of an electronic instrument cluster of an automotive vehicle without adding an additional display device or interface solely for the purpose of providing such self-test results.

Briefly, and in a general way, the invention comprises the use of an existing display, such as a speedometer or a tachometer, for displaying a self-test result during a power-up test sequence. Thus, an electronic instrument cluster embodying principles of the present invention provides not only the usual capability of displaying to the vehicle operator information about various operating parameters that are deemed of interest to the operator during vehicle operation, but also the result of self-testing each time the operator starts the vehicle's motor. For example, an instrument cluster embodying principles of the invention may contain a separate speedometer display for displaying the speed of the vehicle, and it may also contain a separate tachometer display for displaying the speed of the motor which powers the vehicle. The improvement which is afforded by the present invention utilizes one, and preferably both, of these existing displays to present the result of self-testing conducted by the cluster electronics on itself during the power-up test sequence, which occurs when the vehicle is started.

The self-testing is conducted with expediency and does not interfere with the vehicle and motor speeds intended to be displayed by the speedometer and tachometer during vehicle operation, except in the event that circuitry for operating the speedometer or circuitry for operating the tachometer is found to contain a fault as a result of the self-test. In such instances, the speedometer pointer or the tachometer pointer, as the case may be, is parked in a predetermined position indicative of the fault, and it will not function during the ensuing operation of the vehicle.

A fault in a portion of the circuitry other than that for operating either the speedometer or the tachometer is indicated by movement of the speedometer and/or tachometer pointer(s) in a predetermined pattern corresponding to the particular fault detected. The preferred embodiment of the invention that will be hereinafter disclosed in detail possesses the capability for detecting fault in an associated serial data link, in instructions stored in memory in the instrument cluster electronics, and in an odometer circuit that operates the vehicle odometer. By way of example, if a fault is detected in the serial data link, the pointers of both the speedometer and the tachometer are swept in unison between zero and a position corresponding to a first major graduation on the scale of one of them. If a fault is detected in the stored instructions, both the speedometer and tachometer pointers are swept in unison between zero and a position corresponding to a second major graduation on the scale of one of them. If a fault is detected in the odometer circuitry, both the speedometer and tachometer pointers are swept in unison between zero and a position corresponding to a third major graduation on the scale of one of them.

While the broader principles of the invention contemplate that only one of the speedometer and the tachometer pointers need be swept to indicate a self-test result, it has been found desirable to sweep the two gauge pointers in unison to give a more noticeable indication to the vehicle operator at the time of starting the vehicle. Furthermore, it has been found desirable to sweep the pointers in unison in a repetitive pattern to indicate a self-test result, and in the specific example that will be described of the presently preferred embodiment a fault indication is given by sweeping the pointers in unison a total of three times between zero and a scale position corresponding to the indicated fault.

In the usual event that the self-testing detects no faults in any of the tested portions of the instrument cluster, it is appropriate to demonstrate to the vehicle operator that the self-testing has been successfully performed. In the disclosed preferred embodiment, this is accomplished by sweeping both speedometer and tachometer pointers in unison through one complete sweep from one limit of travel to the other before the speedometer and tachometer actively present the actual speedometer and tachometer information. Since it is possible that the meter itself, i.e., either the speedometer or the tachometer, may have an unacceptable movement, full-scale pointer sweep serves to indicate that the self-testing of the electronics has been successfully completed. It also serves to show that the movements of the two meters operate smoothly. The smooth operation of the meter movements is believed to be a reliable indicator that they are functional, and it is deemed most appropriate to utilize the observation of the vehicle operator to judge the smoothness of the movements. Thus, the detection of a faulty movement is best left to the discretion of the operator observing the displays at start-up.

Insofar as the inventor is aware, there are no electronic instrument cluster displays for automotive vehicles which display diagnostic results of self-testing in the manner contemplated by the present invention. It is known, however, to cause the pointers of both a speedometer and tachometer module of an instrument cluster to execute one full sweep at power-up to indicate the application of power to the module. Thus, while the vehicle operator would have had the opportunity to verify that the gauge movements and gauge drive components were functioning at power-up, that prior module incorporated no diagnostic failure mode indications using either the speedometer or the tachometer.

Once a particular fault in the instrument cluster has been indicated by the speedometer and/or tachometer display in accordance with the present invention, an accompanying diagnostic guide may be used for identifying the actual specific source of the fault and taking appropriate corrective action.

Therefore, the invention comprises the following advantages. It enables the vehicle operator to ascertain a full diagnostic status of the instrument cluster every time the vehicle is started. If a fault is detected, the vehicle operator is alerted before operating the vehicle. If a fault is detected, service and repair time may be minimized since the detection, isolation, and identification of a fault are indicated by a high degree of specificity and because of the unique sweeping of the speedometer and tachometer pointers. There should be less likelihood of a mechanic replacing parts in error due to false diagnostic assumptions by the mechanic. Diagnostic testing of the instrument cluster can be performed without the necessity of connecting external test equipment to it and without the time-consuming task of removing the cluster from the vehicle for diagnosis.

Further advantages, benefits, and features of the invention, along with those already mentioned, will be seen in the ensuing description and claims. Drawings accompany the disclosure and present a presently preferred embodiment of the invention according to the best mode contemplated at the present time for carrying out the invention.

DESCRIPTION OF THE PREFERRED EMBODIMENT

Figure 1:
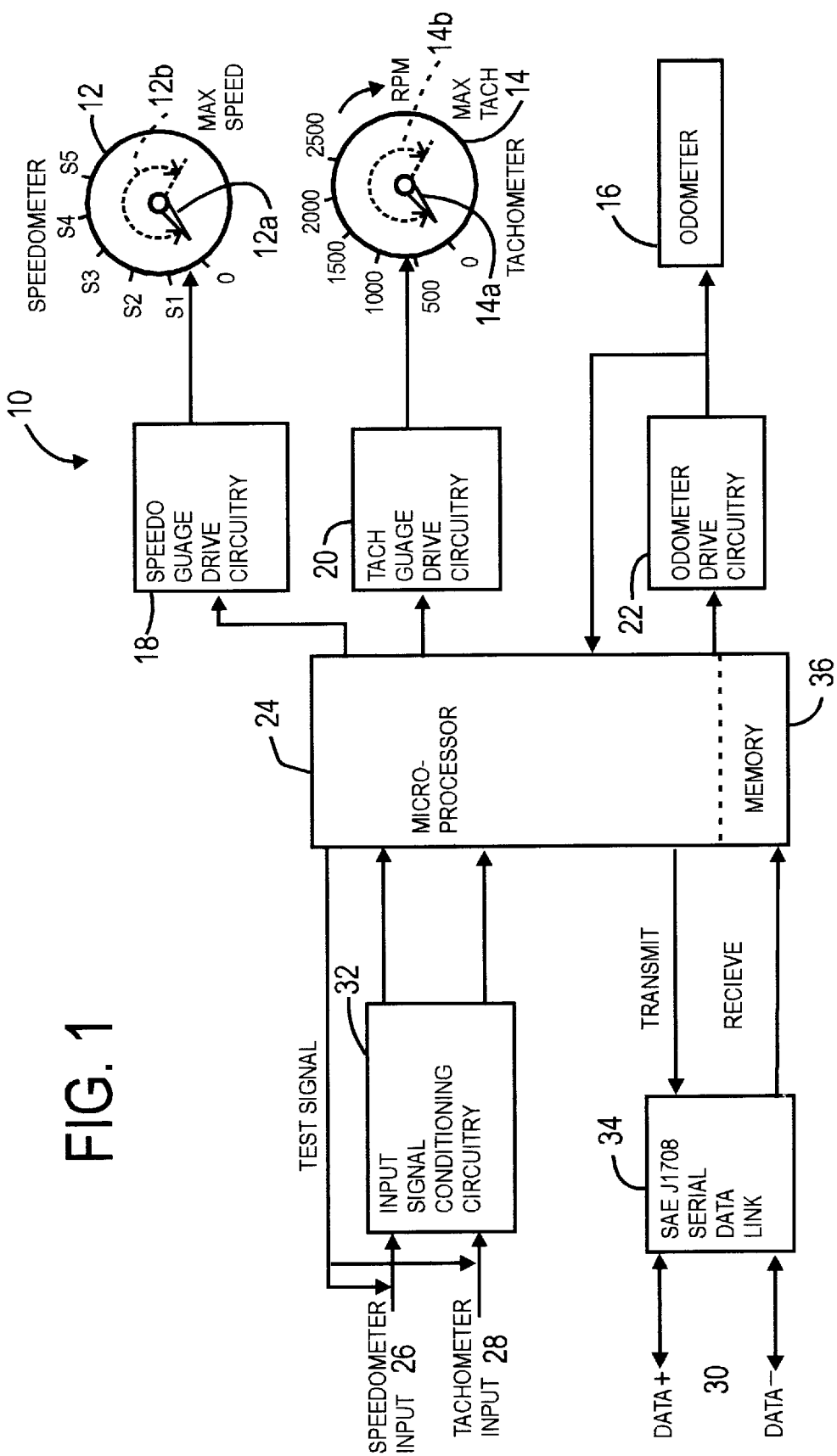
FIG. 1 is a schematic block diagram of a representative electronic instrument cluster embodying principles of the present invention.

FIG. 1 shows an exemplary embodiment of electronic instrument cluster 10 according to the present invention and comprising a speedometer gauge 12 for displaying vehicle speed to the vehicle operator, and a tachometer gauge 14 for displaying to the vehicle operator speed of the motor which powers the vehicle. In addition, the cluster has an odometer display 16 (either electronic or electromechanical) that displays odometer information to the vehicle operator.

Both gauges 12 and 14 are electromechanical, comprising an electromechanical movement that operates a corresponding pointer, 12a in the case of speedometer 12, and 14a in the case of tachometer 14. Speedometer gauge 12 is driven by speedometer gauge drive circuitry 18 while tachometer gauge 14 is operated by tachometer gauge drive circuitry 20. Odometer 16 is operated by odometer drive circuitry 22. All three circuits, 18, 20, and 22, are operated by a microprocessor 24, processing information input to the cluster.

Inputs to instrument cluster 10 include a speedometer input 26, a tachometer input 28, and a data input 30 comprising data+ and data− (reference numeral 30). Speedometer input 26 and tachometer input 28 are input to input signal conditioning circuitry 32 which may comprise individual input signal conditioning circuitry for each input, or circuitry that is shared by multiplexing. The output of the input signal conditioning circuitry 32 is supplied as an input to microprocessor 24. A serial data link 34 interfaces microprocessor 24 with the data+ and data− input 30. The illustrated serial data link 34 is one which conforms with SAE specification J1708.

Speedometer input 26 is obtained from a speed sensor (not shown) that is operatively coupled with a portion of the vehicle power train that indicates vehicle speed, for example the output shaft of a transmission. Tachometer input 28 is obtained from another sensor (not shown) that is operatively coupled with a component of the vehicle that provides a signal indicative of motor speed. In the case of an internal combustion engine for the vehicle motor, the tachometer input may be obtained from a crankshaft rotation sensor. Input signal conditioning circuitry 32 conditions the respective speedometer and tachometer inputs 26, 28 to forms that are acceptable to microprocessor 24. Microprocessor 24 in turn provides signals to the respective drive circuits 18 and 20 for in turn respectively operating the respective speedometer 12 and tachometer 14. For example, where the electromechanical movements of speedometer gauge 12 and tachometer gauge 14 are air core meter-type movements, the respective drive circuits 18 and 20 convert the signals from microprocessor 24 into appropriate signals for operating the respective air core meter movements of the two gauges 12, 14. It should be understood that the input signal conditioning circuitry 32, microprocessor 24, and drive circuits 18 and 20 are conventional.

Since odometer display 16 provides a measurement that is equivalent to the mathematical integral of vehicle speed, microprocessor 24 performs such integration of the speedometer input 26 to produce a suitable output to odometer drive circuitry 22 which in turn operates odometer display 16. This too is conventional technology.

For any of various possible reasons, it may be necessary to input data to microprocessor 24 and/or to read data from microprocessor 24. Such data is transmitted through serial data link 34. Thus, the serial data link may be considered to possess bi-directional capability. This too is conventional technology.

The programming of microprocessor 24 is accomplished by conventional programming techniques. Microprocessor includes a memory 36 containing a set of stored operating instructions forming a program that is executed by the microprocessor to operate the electronic instrument cluster. In accordance with principles of the present invention, microprocessor 24 is also programmed to perform self-testing of the electronic instrument cluster and results of this self-testing are presented via speedometer gauge 12 and tachometer gauge 14. The solid line positions of pointers 12a and 14a in FIG. 1 correspond to gauges 12 and 14 indicating zero vehicle speed and zero engine speed respectively. Each pointer 12a, 14a has a respective sweep range indicated by the respective arrow 12b, 14b. The opposite limit of sweep of each respective pointer 12a, 14a (i.e., full sweep) is designated "maxspeed" and "maxtach" respectively. Accordingly, sweeping of pointer 12a from the zero position to the maxspeed position represents a full-scale sweep from one limit to an opposite limit. Similarly, sweeping of pointer 14a from the zero position to the maxtach position represents a full-scale sweep from one limit to an opposite limit.

Each gauge 12, 14 comprises a corresponding dial having a respective scale of values against which the respective pointer 12a, 14a is read. By way of example, tachometer 14 comprises a scale that has major graduations at 500 RPM, 1000 RPM, 1500 RPM, 2000 RPM, and 2500 RPM. These are designated as such in FIG. 1. The angular ranges of sweep 12b, 14b are identical, and although speedometer 12 has a scale of values measured in a parameter such as miles per hour or kilometers per hour for the purpose of indicating vehicle speed, pointer 12A is capable of sweeping from zero position in angular increments corresponding to the 500 RPM, 1000 RPM, 1500 RPM, 2000 RPM, and 2500 RPM major graduations of tachometer gauge 14. These corresponding major graduations are designated S1, S2, S3, S4, and S5 on the dial of speedometer gauge 12 in FIG. 1.

Figure 2A:
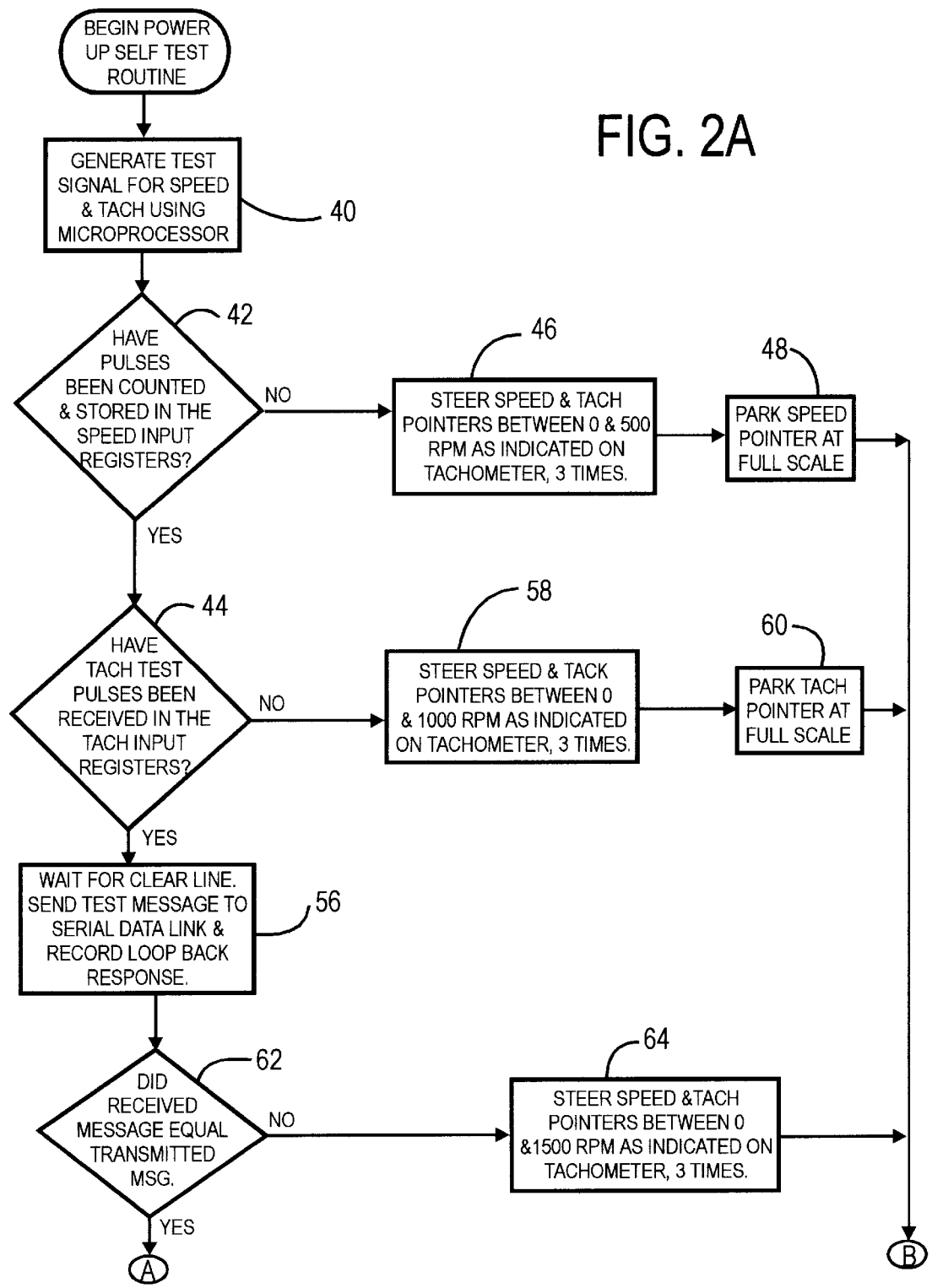
FIGS. 2A and 2B should be considered together as constituting a flow diagram of a self-test procedure utilized in testing the electronic instrument cluster of FIG. 1.
Figure 2B:
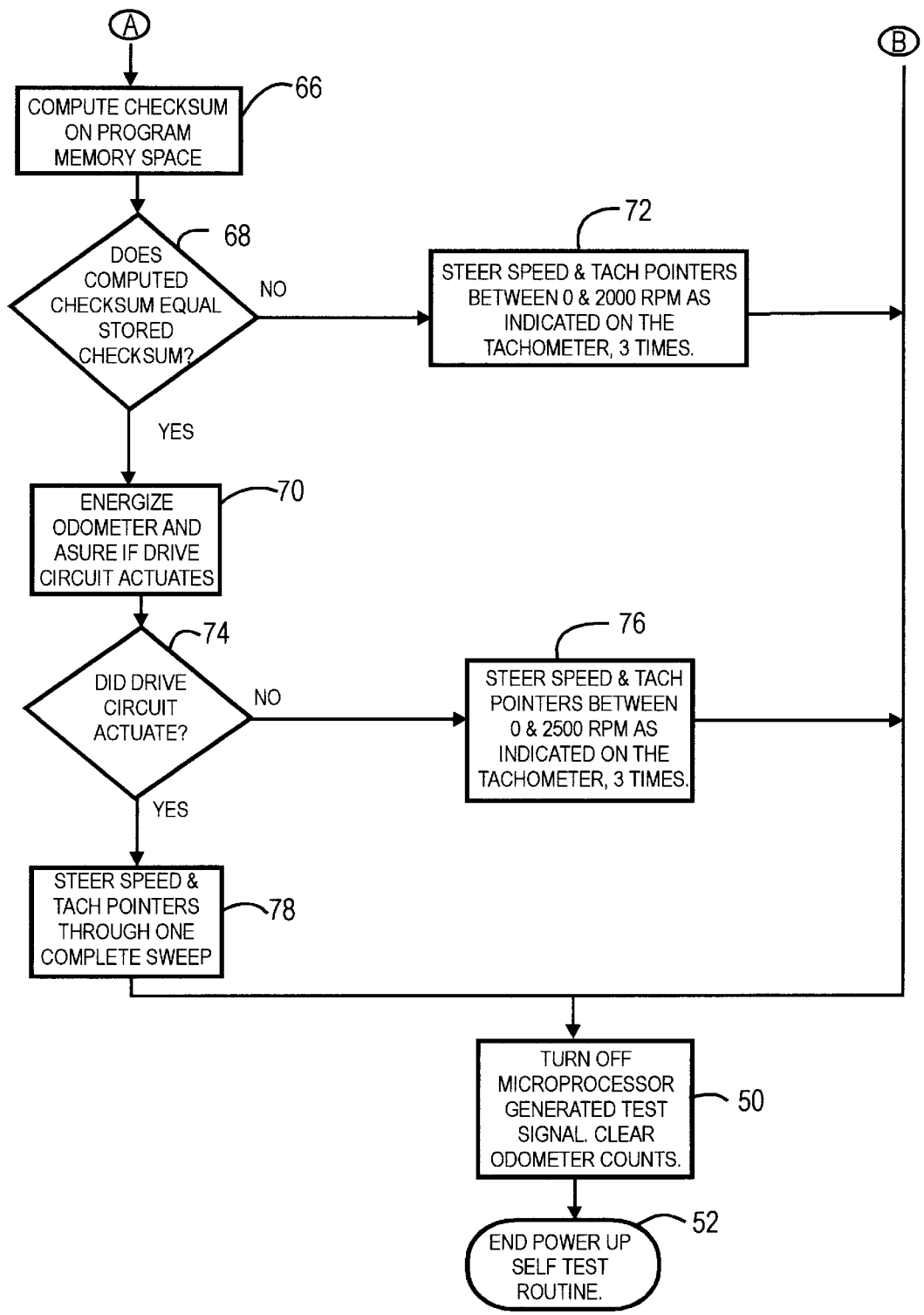

FIGS. 2A and 2B illustrate a flow diagram of the programming of microprocessor 24 to perform the self-test and display the result in accordance with principles of the invention. Of course, it should be understood that details of the specific program for operating the microprocessor comprise a set of instructions for the microprocessor in accordance with the generalized flow diagram of FIGS. 2A and 2B, and these detailed instructions are written using conventional programming language and techniques. The self-test routine is initiated when the vehicle is started by the vehicle operator. (Step 38 in FIG. 2A).

In accordance with the specific self-test sequence disclosed in FIGS. 2A and 2B, the first self-test is that of generating test signals for testing input signal conditioning circuitry 32 and those registers of microprocessor 24 that store vehicle speed and engine speed input information. This step is designated by the reference numeral 40 in FIG. 2A. Microprocessor 24 is programmed to deliver respective test signals to both speedometer and tachometer inputs of input signal conditioning circuitry 32. The input signal conditioning circuitry should in turn deliver corresponding signals to the appropriate and respective registers) of microprocessor 24 for storing vehicle speed and engine speed information. In other words, counts are registered during a counting period.

The next step 42 of FIG. 2A determines if pulses corresponding to the vehicle speed test signal have been entered in the vehicle speed register(s) of microprocessor 24. If the register(s) containing that entry bear a predetermined relationship to the corresponding test signal, typically one of equality, the question posed by step 42 is answered "yes", and the microprocessor therefore proceeds to the next step 44.

Should the question posed by step 42 have been answered "no", this would be an indication of a fault in the portions of the instrument cluster electronics that operate speedometer gauge 12. Thus, if the question posed by step 42 is answered "no", microprocessor 24 delivers signals to both gauge drive circuits 18 and 20 to cause both the speedometer gauge 12 and tachometer gauge 14 to sweep their respective pointers 12a, 12b in unison in identical patterns. The pattern for indicating fault in the portion of the cluster for operating speedometer gauge 12 comprises sweeping pointer 14a from zero RPM to 500 RPM and back a total of three times, and in unison therewith similarly sweeping pointer 12a between zero and S1. (Step 46 in FIG. 2A.)

Since a fault has been indicated in the speedometer system, it has been deemed appropriate to park pointer 12a in the maxspeed position at the conclusion of the fault indication as an encouragement to the vehicle operator to promptly seek service for the indicated fault. (Step 48 in FIG. 2A.) Once this happens, the program flow proceeds to the final step 50 (FIG. 2B) without conducting any further self-testing, and the self-testing is concluded. (Step 52 in FIG. 2B.)

If the speedometer self-test is successfully completed, the step 44 is executed to test the tachometer portion of the cluster in analogous fashion to the speedometer portion. If step 44 determines that pulses corresponding to the motor speed test signal have been entered in motor speed register (s) of microprocessor 24 in predetermined relationship (equality) to the corresponding test signal, the question posed by step 44 is answered "yes", and the microprocessor proceeds to the next step 56.

Should the question posed by step 44 have been answered "no", this would be an indication of a fault in the tachometer portion of the cluster electronics, and therefore microprocessor 24 would deliver to both gauge drive circuits signals to cause the respective pointers 12a, 14a to sweep in unison in identical patterns. In this case the patterns are to sweep pointer 14a from zero RPM to 1000 RPM and back a total of three times while concurrently sweeping pointer 12a from zero to S2 a total of three times. (Step 58 in FIG. 2A.)

Since a fault has been indicated in the tachometer system, it has been deemed appropriate to park pointer 14a in the maxtach position at the conclusion of step 58 to encourage prompt servicing. (Step 60 in FIG. 2A.) The program thereupon discontinues further self-testing, proceeding to steps 50 and 52.

If the tachometer self-test is passed, the program proceeds to step 56 for testing of serial data link 34. By this step microprocessor 24 transmits a test message to the data link, and monitors the received re-transmitted response. If the received message is the same as the transmitted one, the data link is deemed to have passed the self-test, in which case the question posed by step 62 immediately following step 56 is answered "yes", and the program proceeds to step 66 (top of FIG. 2B).

If, however, the question posed by step 62 is answered "no" instead, this is an indication of fault in the data link portion of the electronics, and fault signal is given. This fault signal comprises microprocessor 24 causing both pointers 12a, 14a to sweep in unison between zero RPM and 1500 RPM for pointer 14a, and between zero and S3 for pointer 12a, a total of three times (Step 64). Further self-testing is discontinued with the program proceeding directly to steps 50 and 52.

If the data link self-test is passed, the program proceeds to step 66 which tests memory 36 by computing a checksum for the stored memory instructions. The computed checksum is evaluated by step 68 with a stored checksum that is also stored in another portion of memory. If the question posed by step 68 is answered "yes", the test of the stored instructions is deemed to have been passed, and the program proceeds to step 70.

If step 66 is on the other hand answered "no", this indicates a fault in the stored memory instructions which is indicated by pointers 12a, 14a. Pointer 14a is swept three times between zero RPM and 2000 RPM, and pointer 12a is swept in unison with pointer 14a three times between zero and S4 (Step 72). Further self-testing is discontinued with the program proceeding directly to steps 50 and 52.

If the checksum self-test is successfully completed, the program executes step 70, testing the odometer portion. If the question posed by step 74, which ensues from step 70, is answered "no", a fault in the odometer portion is indicated by sweeping pointers 12a, 14a in unison (Step 76). Pointer 14a is swept three times between zero RPM and 2500 RPM while pointer 12a is 83 swept three times between zero and S5. Further self-testing is discontinued with the program proceeding to steps 50 and 52.

Successful completion of the odometer self-test results in one final test that serves two purposes. The first is to demonstrate to the observer that the previous self-tests were successfully completed; the second is to prove to the observer that the meter movements are operating properly. This final test (Step 78) comprises sweeping both pointers in unison one full sweep from zero to maximum and back. Smooth uniform sweeping of both will indicate proper movement performance. Departure of either or both pointers from this ideal will indicate the possibility of an erratic movement that should be checked out. As mentioned earlier, it is believed appropriate to rely on the observer's judgment as to whether a pointer executes a smooth sweep. After step 78, the program proceeds to steps 50 and 52.

Based on the foregoing description, a new and useful means for self-testing of an electronic instrument cluster of an automotive vehicle has been disclosed. Principles of the invention are applicable to the disclosed embodiment and equivalent embodiments that fall within the scope of the following claims. For example, while further self-testing was discontinued once a fault has been indicated, the program may be written to continue the self-testing after a fault has been indicated.

What is claimed is:

1. An electronic instrument cluster of an automotive vehicle comprising a meter for displaying to a vehicle operator the value of a parameter associated with operation of the vehicle, said meter comprising an electromechanical meter movement that operates a pointer that is read against a scale of values for the parameter, said cluster comprising electronic circuit means, said electronic circuit means comprising an input at which digital data representing the value of the parameter is received and an output that delivers to the meter movement an electrical signal corresponding to the digital data received at said input, and said electronic circuit means comprising self- test means for administering to said electronic circuit means a particular self-test and presenting to an observer a result of such particular self-test by means of said meter, characterized in that said self-test means comprises means for presenting such result by causing said meter movement to sweep said pointer in a repetitive pattern corresponding to such particular self-test.

2. An electronic instrument cluster of an automotive vehicle as set forth in claim 1 in which the sweeping of said pointer in such a repetitive pattern corresponding to such particular self-test signifies that such particular self-test has detected a fault in the instrument cluster.

3. An electronic instrument cluster of an automotive vehicle as set forth in claim 2 in which said means for presenting such result by causing said meter movement to sweep said pointer in a repetitive pattern corresponding to such particular self-test comprises means for repetitively sweeping said pointer from a first position to a second position spaced from the first position and back to the first position.

4. An electronic instrument cluster of an automotive vehicle as set forth in claim 3 in which said means for repetitively sweeping said pointer from a first position to a second position spaced from the first position and back to the first position comprises means for sweeping said pointer from the first position to the second position and back to the first position a total of three times.

5. An electronic instrument cluster of an automotive vehicle as set forth in claim 3 in which said self-test means comprises means for administering to said electronic circuit means a second particular self-test that is different from the first-mentioned particular self-test, and said electronic circuit means comprises means for presenting a result of such second particular self-test by causing said meter movement to sweep said pointer in a pattern corresponding to such second particular self-test, the sweeping of said pointer in such a pattern corresponding to such second particular self-test signifying that such second particular self-test has detected a fault in the instrument cluster, said means for presenting a result of such second particular self-test by causing said meter movement to sweep said pointer in a pattern corresponding to such second particular self-test comprising means for repetitively sweeping said pointer from the first position to a third position spaced from both the first and second positions and back to the first position.

6. An electronic instrument cluster of an automotive vehicle as set forth in claim 5 in which said self-test means operates to perform the first-mentioned particular self-test prior to performing the second particular self-test and to present such result of such first-mentioned particular self-test prior to said self-test means performing the second particular self-test, and wherein the third position is spaced farther from the first position than the second position is spaced from the first position whereby such result of the second particular self- test is presented by a greater amount of pointer sweep than that by which such result of the first-mentioned particular test is presented.

7. An electronic instrument cluster of an automotive vehicle as set forth in claim 2 in which said self-test means comprises means for administering to said electronic circuit means a second particular self-test that is different from the first-mentioned particular self-test and means for presenting a result of such second particular self-test by causing said meter movement to sweep said pointer in a pattern corresponding to such second particular self-test.

8. An electronic instrument cluster of an automotive vehicle as set forth in claim 7 in which said means for presenting a result of such second particular self-test by causing said meter movement to sweep said pointer in a pattern corresponding to such second particular self-test comprises means for repetitively sweeping said pointer from a first position to a second position spaced from the first position and back to the first position, the sweeping of said pointer in such a pattern corresponding to such second particular self-test signifying that such second particular self-test has detected a fault in the instrument cluster.

9. An electronic instrument cluster of an automotive vehicle as set forth in claim 2 in which said electronic circuit means comprises a register for registering during a counting period pulses representing a speed signal input to the instrument cluster and means for causing said meter movement to operate said pointer to a position indicating the number of pulses registered in said register during such counting period, said self-test means administers such particular self-test by applying a predetermined number of pulses to said register during a self-test period, and said means for presenting such result comprises means for comparing the actual number of pulses registered in said register during such self-test period with said predetermined number and for causing said meter movement to sweep said pointer in a repetitive pattern corresponding to such particular self-test if the actual number of pulses registered in said register during such self-test period fails to bear a predetermined relation to said predetermined number.

10. An electronic instrument cluster of an automotive vehicle as set forth in claim 2 in which a serial data link interfaces said electronic circuit means with a data source that is external to the instrument cluster, said self-test means administers such particular self-test by transmitting particular data to said serial data link and receiving a re-transmission of such particular data, and said means for presenting such result comprises means for comparing such particular data transmitted to said serial data link with the received re-transmission of such particular data and for causing said meter movement to sweep said pointer in a repetitive pattern corresponding to such particular self-test if the received re-transmission of such particular data fails to bear a predetermined relation to the transmitted particular data.

11. An electronic instrument cluster of an automotive vehicle as set forth in claim 2 in which the instrument cluster comprises an odometer, said odometer comprising a display for presenting odometric data and driver circuitry for driving said odometer display, said self-test means administers such particular self-test by applying a test signal to said odometer and receiving a response, and said means for presenting such result comprises means for comparing the received response with a predefined response and for causing said meter movement to sweep said pointer in a repetitive pattern corresponding to such particular self-test if the received response fails to bear a predetermined relation to the predefined response.

12. An electronic instrument cluster of an automotive vehicle as set forth in claim 2 in which said electronic circuit means comprises a microprocessor having a memory programmed with a set of instructions, said self-test means administers such particular self-test by conducting a test on the set of instructions programmed in the microprocessor memory, and said means for presenting such result comprises means for comparing a checksum obtained by conducting the test on the set of instructions programmed in the microprocessor memory with a predetermined checksum and for causing said meter movement to sweep said pointer in a repetitive pattern corresponding to such particular self-test if the checksum obtained by conducting the test on the set of instructions programmed in the microprocessor memory fails to bear a predetermined relation to the predetermined checksum.

13. An electronic instrument cluster of an automotive vehicle comprising a meter for displaying to a vehicle operator the value of a parameter associated with operation of the vehicle, said meter comprising an electromechanical meter movement that operates a pointer that is read against a scale of values for the parameter, said cluster comprising electronic circuit means having an input at which digital data is received and an output that delivers to the meter movement an electrical signal corresponding to the digital data received at said input, and said electronic circuit means comprising self-test means for self-testing itself and presenting a result of such self-testing by means of said meter, characterized in that said self-test means comprises means for applying at least one test signal to at least one portion of said electronic circuit means, means for comparing a response of said at least one portion of said electronic circuit means to such at least one test signal with a corresponding predetermined response, and means for presenting a result of such self-testing by causing said meter movement to sweep said pointer in a manner indicating such result.

14. An electronic instrument cluster of an automotive vehicle as set forth in claim 13 characterized further in that said means for presenting a result of such self-testing by causing said meter movement to sweep said pointer in a manner indicating such result signifies that such self-testing has detected no fault in said at least one portion of said electronic circuit means.

15. An electronic instrument cluster of an automotive vehicle as set forth in claim 14 characterized further in that said means for presenting a result of such self-testing by causing said meter movement to sweep said pointer in a manner indicating that such self-testing has detected no fault in said at least one portion of said electronic circuit means comprises means for causing said meter movement to sweep said pointer from one limit of said scale of values to another limit of said scale of values and to return to said one limit.

16. An electronic instrument cluster of an automotive vehicle as set forth in claim 13 characterized further in that said scale of values represents vehicle speed thereby rendering said meter a device for indicating a speed associated with vehicle operation.

17. An electronic instrument cluster of an automotive vehicle as set forth in claim 16 characterized further in that said at least one portion of said electronic circuit means comprises a speed circuit that receives an input speed signal conveying speed information for presentation on said meter, said speed circuit comprises signal conditioning circuitry for conditioning such input speed signal, and said at least one portion of said electronic circuit means includes said signal conditioning circuitry.

18. An electronic instrument cluster of an automotive vehicle as set forth in claim 16 characterized further in that said at least one portion of said electronic circuit means comprises a speed circuit that receives an input speed signal conveying speed information for presentation on said meter, and if said self-test means detects a fault in said speed circuit, said means for presenting a result of such self-testing causes said meter movement to park said pointer at a non-zero position of said scale of values and render said meter movement non-responsive to operation of said speed circuit by such input speed signal.

19. An electronic instrument cluster of an automotive vehicle as set forth in claim 18 characterized further in that if said self-test means detects a fault in said speed circuit, said means for presenting a result of such self-testing causes said meter movement to park said pointer at a limit of said scale of values that is opposite a zero limit of said scale of values.

20. An electronic instrument cluster of an automotive vehicle as set forth in claim 13 characterized further in that said means for presenting a result of such self-testing by causing said meter movement to sweep said pointer in a manner indicating such result signifies that such self-testing has detected fault in said at least one portion of said electronic circuit means, and such fault is indicated by said means for presenting a result of such self-testing causing said meter movement to sweep said pointer in repetitive pattern corresponding to such fault.

21. An electronic instrument cluster of an automotive vehicle comprising a meter for displaying to a vehicle operator the value of a parameter associated with operation of the Vehicle, said meter comprising an electromechanical meter movement that operates a pointer that is read against a scale of values for the parameter, said cluster comprising electronic circuit means, said electronic circuit means comprising an input at which digital data representing the value of a parameter is received and an output that delivers to the meter movement an electrical signal corresponding to the digital data received at said input, said electronic circuit means comprising self-test means for self-testing itself and presenting a result of such self-testing by means of said meter, characterized in that said self-test means comprises means for self-testing each of plural circuit portions of said electronic circuit means, means for presenting fault in any of said plural circuit portions of said electronic circuit means by causing said meter movement to sweep said pointer in a particular manner correlated to the particular circuit portion found to contain a fault, and means for presenting lack of fault in any of said circuit portions upon completion of the self-testing thereof by causing said meter movement to sweep said pointer in a manner that is distinct from the particular manners for indicating fault.

22. An electronic instrument cluster of an automotive vehicle as set forth in claim 21 characterized further in that said meter comprises one or both of a speedometer for indicating vehicle speed and a tachometer for indicating speed of a motor for powering the vehicle, and said means for presenting lack of fault in any of said circuit portions upon completion of the self-testing thereof comprises means for causing said meter movement to sweep said pointer from one limit of said scale of values to another limit of said scale of values and back to said one limit.

* * * * *